United States Patent
Matsuda

(10) Patent No.: US 11,476,696 B2
(45) Date of Patent: Oct. 18, 2022

(54) CHARGE AND DISCHARGE CONTROL APPARATUS AND ELECTRONIC DEVICE

(71) Applicant: SEIKO EPSON CORPORATION, Tokyo (JP)

(72) Inventor: Kinya Matsuda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 43 days.

(21) Appl. No.: 17/207,002

(22) Filed: Mar. 19, 2021

(65) Prior Publication Data

US 2021/0296920 A1    Sep. 23, 2021

(30) Foreign Application Priority Data

Mar. 23, 2020  (JP) .............................. JP2020-050636

(51) Int. Cl.
*H02J 7/00*    (2006.01)
*G01R 31/3842*  (2019.01)

(52) U.S. Cl.
CPC .... *H02J 7/007182* (2020.01); *G01R 31/3842* (2019.01); *H02J 7/00047* (2020.01); *H02J 7/0047* (2013.01)

(58) Field of Classification Search
CPC .............. H02J 7/0047; H02J 7/007182; H02J 7/00047; G01R 31/3842
USPC ........ 320/132, 134, 136, 157, 159, 162, 164
See application file for complete search history.

(56) References Cited

U.S. PATENT DOCUMENTS

| | | | |
|---|---|---|---|
| 2013/0335009 A1* | 12/2013 | Katsumata | ............ H02J 7/0042 702/63 |
| 2016/0259012 A1* | 9/2016 | Sejima | ............... G01R 31/3842 |
| 2020/0103468 A1* | 4/2020 | Watanabe | ............ G01R 31/374 |

FOREIGN PATENT DOCUMENTS

JP    2019-013109    1/2019

* cited by examiner

*Primary Examiner* — Edward Tso
*Assistant Examiner* — Aaron Piggush
(74) *Attorney, Agent, or Firm* — Rankin, Hill & Clark LLP

(57) ABSTRACT

A apparatus configured to control charge and discharge of a battery, and to obtain a charging capacity of the battery, the apparatus includes: a first register configured to store voltage sections each including a lower and upper limit voltage; a circuit configured to measure a time from when the battery voltage at the time of charging the battery or a calculated value of that battery voltage exceeds the lower limit voltage to when that battery voltage or the calculated value reaches the upper limit voltage; an circuit configured to obtain section charging capacities, based on products of the charging current and the times; a second register configured to store the section charging capacities; and a circuit configured to read at least one of the section charging capacities stored in the second register, based on the battery voltage at the time of discharging the battery or the calculated value.

7 Claims, 7 Drawing Sheets

| CONTENT OF NONVOLATILE MEMORY | | | | | | | | | | | | | | | | |
|---|---|---|---|---|---|---|---|---|---|---|---|---|---|---|---|---|
| ADDRESS | bit 15 | bit 14 | bit 13 | bit 12 | bit 11 | bit 10 | bit 9 | bit 8 | bit 7 | bit 6 | bit 5 | bit 4 | bit 3 | bit 2 | bit 1 | bit 0 |
| (1) | VOLTAGE V_Div1 | | | | | | | | VOLTAGE V_Div0 | | | | | | | |
| (2) | VOLTAGE V_Div3 | | | | | | | | VOLTAGE V_Div2 | | | | | | | |
| (3) | VOLTAGE V_Div5 | | | | | | | | VOLTAGE V_Div4 | | | | | | | |
| (4) | VOLTAGE V_Div7 | | | | | | | | VOLTAGE V_Div6 | | | | | | | |

FIG. 3

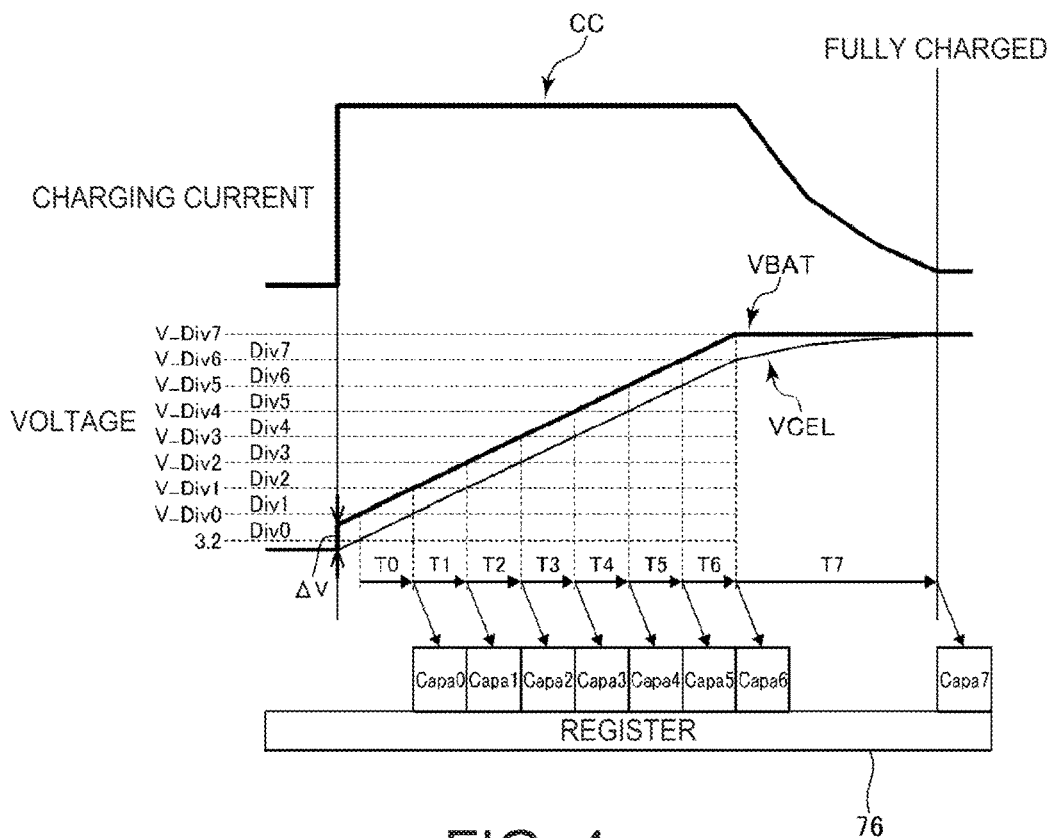

FIG. 4

| CONTENT OF REGISTER | | | | | | | | | | | | | | | | |
|---|---|---|---|---|---|---|---|---|---|---|---|---|---|---|---|---|
| ADDRESS | bit 15 | bit 14 | bit 13 | bit 12 | bit 11 | bit 10 | bit 9 | bit 8 | bit 7 | bit 6 | bit 5 | bit 4 | bit 3 | bit 2 | bit 1 | bit 0 |
| (1) | UPDT | | - | | SECTION CHARGING CAPACITY Capa0 | | | | | | | | | | | |
| (2) | UPDT | | - | | SECTION CHARGING CAPACITY Capa1 | | | | | | | | | | | |
| (3) | UPDT | | - | | SECTION CHARGING CAPACITY Capa2 | | | | | | | | | | | |
| (4) | UPDT | | - | | SECTION CHARGING CAPACITY Capa3 | | | | | | | | | | | |
| (5) | UPDT | | - | | SECTION CHARGING CAPACITY Capa4 | | | | | | | | | | | |
| (6) | UPDT | | - | | SECTION CHARGING CAPACITY Capa5 | | | | | | | | | | | |
| (7) | UPDT | | - | | SECTION CHARGING CAPACITY Capa6 | | | | | | | | | | | |
| (8) | UPDT | | - | | SECTION CHARGING CAPACITY Capa7 | | | | | | | | | | | |

FIG. 5

CHARGE AND DISCHARGE CONTROL APPARATUS AND ELECTRONIC DEVICE

The present application is based on, and claims priority from JP Application Serial Number 2020-050636, filed Mar. 23, 2020, the disclosure of which is hereby incorporated by reference herein in its entirety.

BACKGROUND

1. Technical Field

The present disclosure relates to a charge and discharge control apparatus and an electronic device.

2. Related Art

JP-A-2019-13109 discloses a power storage system including a charge and discharge unit that charges and discharges a storage battery and a power storage control unit that manages the state of the storage battery. The power storage system includes: a current integration unit that integrates a current value at the time of charge or discharge; an estimated deterioration information calculation unit that calculates estimated deterioration information including an SOH (State Of Health) and a full charge calculation capacity of the storage battery; an SOC (State Of Charge) curve calculation unit that obtains an SOC curve indicating a temporal change in an SOC using the current integration value and the estimated deterioration information; and a current calculation unit that obtains a corrected charging current value by multiplying the charging current value by the SOH.

In such a power storage system, the charge and discharge unit charges the storage battery based on the corrected charging current value. This makes it possible to set an appropriate charging current value in accordance with deterioration of the storage battery, and reduce the damage to the storage battery due to charging.

The power storage system disclosed in JP-A-2019-13109 performs operation confirmation and inspection of the apparatus by performing maintenance. At this time, the power storage system obtains the SOH and the full charge calculation capacity at the time of discharge. Then, the SOH is corrected based on the SOH and the full charge calculation capacity obtained at the time of maintenance. In this manner, it is possible to obtain the SOH reflecting the actual full charge practical amount. As a result, a more appropriate charging current value can be obtained.

JP-A-2019-13109 is an example of the related art.

In the power storage system disclosed in JP-A-2019-13109, a current integration value at the time of discharge is calculated by integrating a current value flowing out from the storage battery in a fully charged state. However, the current value at the time of discharge changes according to the state of a load coupled to the storage battery. For this reason, even if the current value at the time of discharge is integrated, it is difficult to obtain the change in the charging capacity with high accuracy. Also, a complicated circuit is needed for a circuit used for detecting the charge released from the storage battery.

SUMMARY

A charge and discharge control apparatus according to an application example of the present disclosure is a charge and discharge control apparatus configured to control charge and discharge of a battery, and to obtain a charging capacity of the battery, the charge and discharge control apparatus including:

a voltage measurement circuit configured to measure a battery voltage of the battery;

a charging current control circuit configured to control a charging current flowing at the time of charging the battery;

a first register configured to store a plurality of voltage sections each including a lower limit voltage value and an upper limit voltage value;

a time measurement circuit configured to measure, for each voltage section, a time from when the battery voltage at the time of charging the battery or a calculated value of that battery voltage exceeds the lower limit voltage value to when that battery voltage or the calculated value of that battery voltage reaches the upper limit voltage value;

an arithmetic circuit configured to obtain section charging capacities corresponding to the respective voltage sections, based on products of a current value of the charging current and the times;

a second register configured to store the section charging capacities; and a charging capacity obtainment circuit configured to read at least one of the plurality of section charging capacities stored in the second register, based on the battery voltage at the time of discharging the battery or a calculated value of that battery voltage.

An electronic device according to the application example of the present disclosure including:

a charge and discharge control apparatus according to the application example of the present disclosure.

BRIEF DESCRIPTION OF THE DRAWINGS

The disclosure will be described with reference to the accompanying drawings, wherein like numbers reference like elements.

FIG. 3 is a table showing an example of a lower limit voltage value and an example of an upper limit voltage value of a voltage section stored in each address of a nonvolatile memory shown in FIG. 2.

FIG. 4 is a graph showing a relationship between an elapsed time and a battery voltage VBAT and a cell voltage VCEL when a battery is charged, and a relationship between the elapsed time and a current value CC of the charging current.

FIG. 5 is a table showing section charging capacities Capa0 to Capa7 stored in respective address of a register shown in FIG. 2.

DESCRIPTION OF EXEMPLARY EMBODIMENTS

Hereinafter, preferred embodiments of a charge and discharge control apparatus and an electronic device according to the present disclosure will be described in detail with reference to the accompanying drawings.

1. Electronic Device

Figure 1:
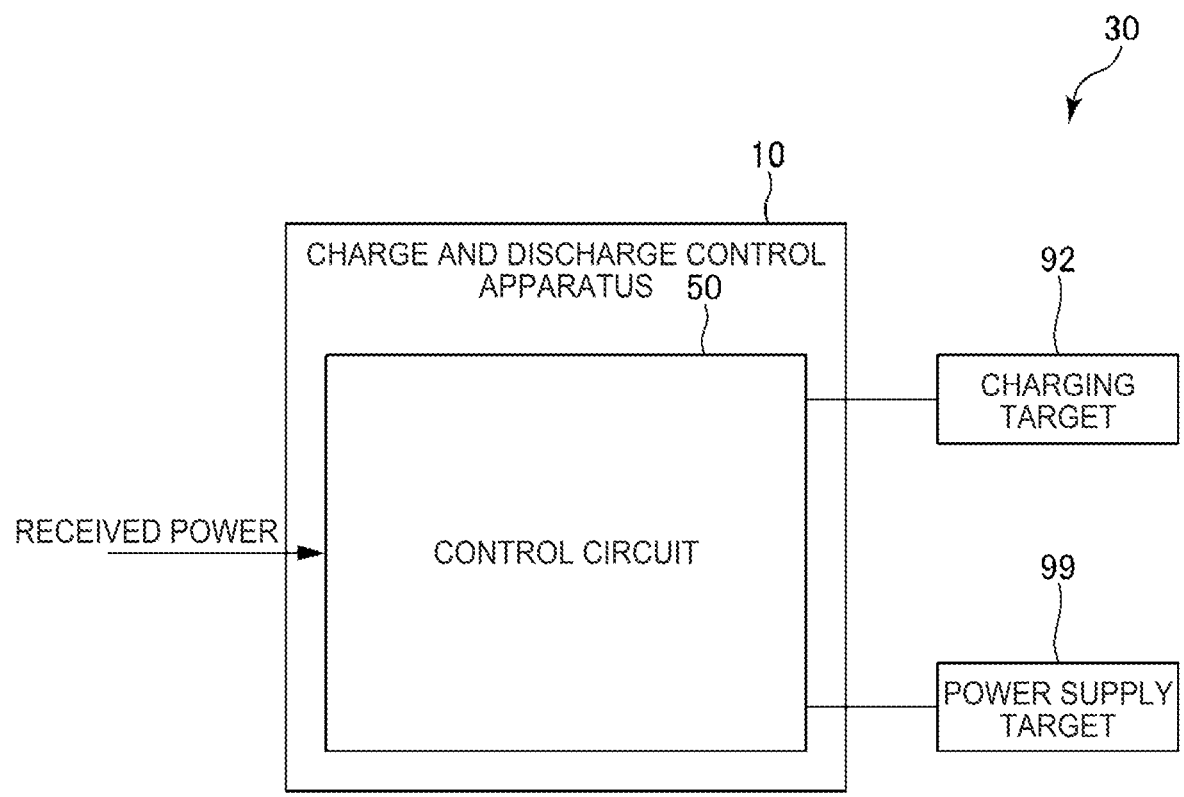
FIG. 1 is a block diagram showing a configuration of an electronic device according to an embodiment.
Figure 2:
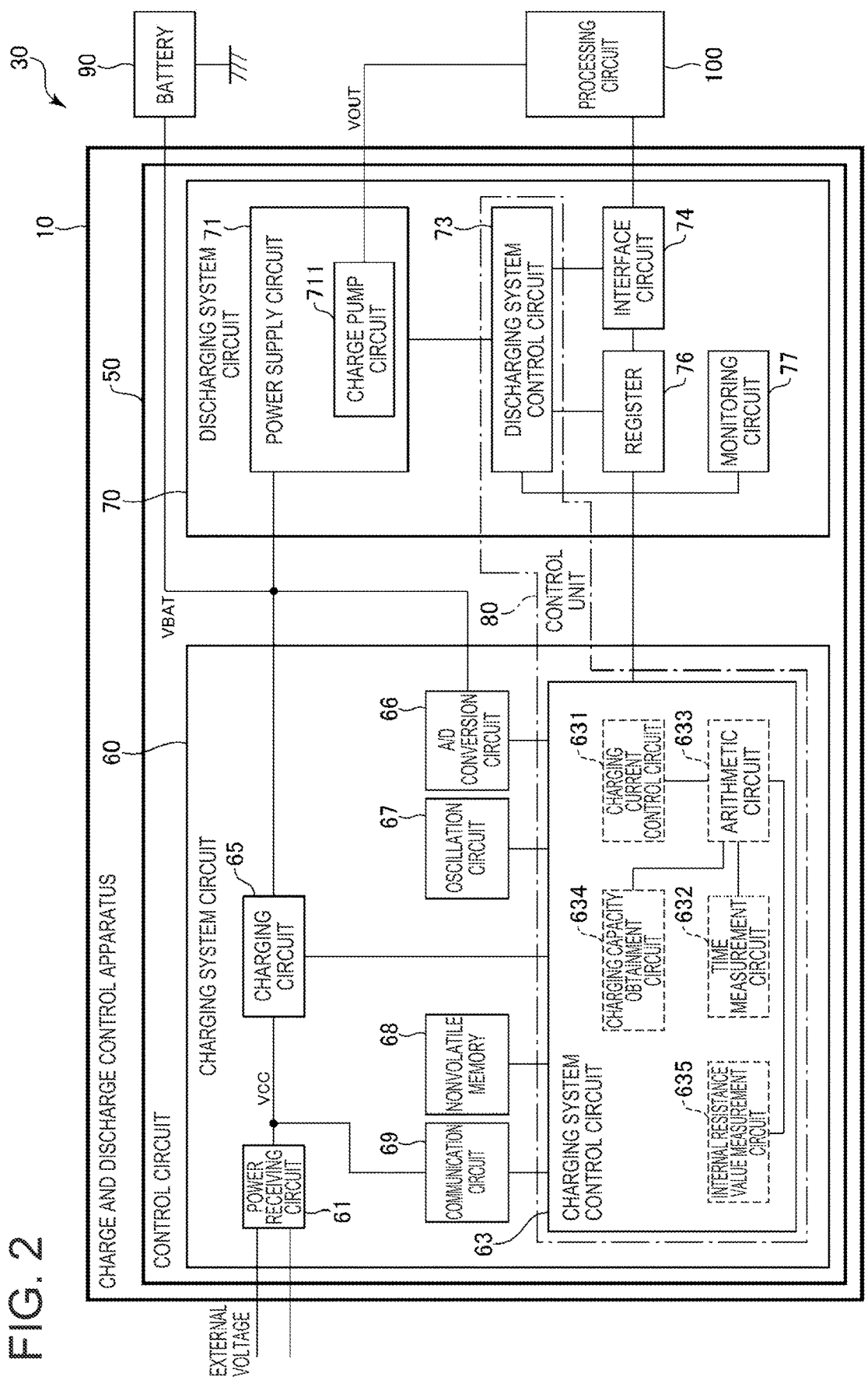
FIG. 2 is a block diagram showing a detailed configuration of the electronic device shown in FIG. 1.

FIG. 1 is a block diagram showing a configuration of an electronic device according to an embodiment. FIG. 2 is a block diagram showing a detailed configuration of the electronic device shown in FIG. 1.

An electronic device 30 shown in FIG. 1 includes a charge and discharge control apparatus 10 including a control circuit 50, a power supply target 99, and a charging target 92.

The power supply target 99 is a device to which the control circuit 50 supplies power, and is, for example, a processing circuit 100 shown in FIG. 2.

The charging target 92 is a device to be charged by the control circuit 50, and is, for example, a battery 90 shown in FIG. 2.

The control circuit 50 performs constant current charging, constant voltage charging, or the like of the charging target 92 based on received power, and supplies power to the power supply target 99 based on the received power or discharge power from the charging target 92.

The control circuit 50 may also be configured to receive power by contact-type power transmission via a wired power supply line, or may also be configured to receive power by contactless power transmission.

The processing circuit 100 controls the operation of the control circuit 50. Specifically, the processing circuit 100 executes various control processes for controlling the control circuit 50. The processing circuit 100 controls the operation of the control circuit 50 by, for example, issuing a command to the control circuit 50, or setting various types of information to the control circuit 50. The processing circuit 100 is realized by a processor such as a DSP (Digital Signal Processor), a CPU (Central Processing Unit), an ASIC, or a microcontroller. The processing circuit 100 may also perform various digital signal processing such as audio processing and image processing.

The battery 90 is, for example, a rechargeable secondary battery. Examples of the secondary battery include a lithium secondary battery such as a lithium ion secondary battery and a lithium ion polymer secondary battery, and a nickel secondary battery such as a nickel-hydrogen secondary battery and a nickel-cadmium secondary battery.

2. Charge and Discharge Control Apparatus according to First Embodiment 2.1 Configuration of Charge and Discharge Control Apparatus The control circuit 50 included in the charge and discharge control apparatus 10 shown in FIG. 2 includes a charging system circuit 60 and a discharging system circuit 70.

The charging system circuit 60 includes: a power receiving circuit 61; a charging system control circuit 63; a charging circuit 65; an A/D conversion circuit 66 (a voltage measurement circuit); an oscillation circuit 67; a nonvolatile memory 68 (a first register); and a communication circuit 69. The discharging system circuit 70 includes: a power supply circuit 71; a discharging system control circuit 73; an interface circuit 74; a register 76 (a second register); and a monitoring circuit 77. Hereinafter, each part of the charging system circuit 60 and the discharging system circuit 70 will be described in detail.

The charging system circuit 60 shown in FIG. 2 is a circuit for charging the battery 90. Specifically, the charging system circuit 60 operates based on an external voltage, and charges the battery 90.

The charging system circuit 60 performs, for example, control for charging the battery 90 with a constant current, control for charging the battery 90 with a constant voltage, and the like. Specifically, the charging system circuit 60 first performs constant current charging of the battery 90, and then switches from constant current charging to constant voltage charging when the charging voltage of the battery 90 reaches a predetermined voltage.

In the constant current charging, the battery 90 is charged with a constant charging current at which the current is constant, and in the constant voltage charging, the battery 90 is charged with a constant charging voltage at which the voltage is constant. By performing constant current charging, the charging voltage of the charging target can be increased in a short time. Because the charging current gradually decreases by performing constant voltage charging, a rapid change in the charging current is suppressed, and the current value and the voltage value of the charging are stabilized. The charging current in the constant current charging does not need to be completely constant and may be substantially constant, and the charging voltage in the constant voltage charging does not need to be completely constant and may be substantially constant.

The power receiving circuit 61 converts, for example, an AC external voltage into a DC rectified voltage VCC and outputs the DC rectified voltage VCC.

The charging circuit 65 has a function of receiving the rectified voltage VCC, operating based on the rectified voltage VCC, and charging the battery 90. Specifically, the charging circuit 65 charges the battery 90 by constant current charging or constant voltage charging based on the rectified voltage VCC.

The charging system control circuit 63 controls the operation of the charging circuit 65 to charge the battery 90. The charging system control circuit 63 also controls the operations of the interface circuit 74 and the register 76. The charging system control circuit 63 controls, for example, interface processing of the interface circuit 74, and controls writing and reading of information to and from the register 76. Specifically, the charging system control circuit 63 reads information from the register 76, and controls the operation of the charging circuit 65.

The charging system control circuit 63 includes a charging current control circuit 631, a time measurement circuit 632, an arithmetic circuit 633, and a charging capacity obtainment circuit 634.

When the battery 90 is charged by the charging circuit 65, the charging current control circuit 631 controls a current value of a charging current by indicating the charging current to the charging circuit 65.

The time measurement circuit 632 measures a time required for a change in voltage when the battery 90 is charged, based on information of a voltage section stored in the nonvolatile memory 68 (the first register) described later. Specifically, information of the voltage section having a lower limit voltage value and an upper limit voltage value is stored in the nonvolatile memory 68. Then, when the battery voltage VBAT increases with charging, the time measurement circuit 632 measures a time required for the battery voltage VBAT or the calculated value of the battery voltage VBAT to reach the upper limit voltage value after exceeding the lower limit voltage value.

The arithmetic circuit 633 reads the current value of the charging current obtained from the charging current control circuit 631, and a required time obtained from the time measurement circuit 632. Then, the arithmetic circuit 633 obtains a section charging capacity corresponding to the voltage section stored in the nonvolatile memory 68, based on the product of the current value of the charging current and the required time. That is to say, when, for example, eight voltage sections are set in the nonvolatile memory 68, the arithmetic circuit 633 obtains a maximum of eight section charging capacities corresponding to the eight voltage sections. The arithmetic circuit 633 outputs the obtained section charging capacities to the register 76 and stores the obtained section charging capacities in the register 76. The register 76 stores the section charging capacities for respective voltage sections described above.

The charging capacity obtainment circuit 634 reads at least one of the plurality of section charging capacities stored in the register 76, based on the battery voltage VBAT at the time of discharging the battery 90 or the calculated value of that battery voltage VBAT. The read section charging capacity is an index for obtaining the charging capacity of the battery 90 at that time. Accordingly, the arithmetic circuit 633 may also have a function of obtaining the charging capacity of the battery 90 at that time, based on the read section charging capacity.

The control circuit 50 can output the read section charging capacity or the charging capacity of the battery 90 to an external device or the like via the communication circuit 69 described later, for example. In this manner, the external device can display the charging capacity of the battery 90 on a display unit or the like and notify a user or the like of the external device of the charging capacity of the battery 90.

The A/D conversion circuit 66 performs, for example, A/D conversion of the battery voltage VBAT of the battery 90, and outputs the value of the converted battery voltage VBAT to the charging system control circuit 63 and the like. Accordingly, the A/D conversion circuit 66 is a voltage measurement circuit that measures the battery voltage VBAT of the battery 90.

The oscillation circuit 67 is a circuit that generates a clock signal. The oscillation circuit 67 is realized by, for example, a pulse generator or the like that generates a pulse by turning on and off a signal.

The nonvolatile memory 68 is realized by, for example, an EEPROM (Electrically Erasable Programmable Read-Only Memory) capable of electrically erasing data, an OTP (One Time Programmable) memory using an FAMOS (Floating gate Avalanche injection MOS), or the like. In FIG. 2, the nonvolatile memory 68 is provided in the control circuit 50, but the nonvolatile memory 68 may also be provided outside the control circuit 50.

The communication circuit 69 transmits, for example, the output state of the rectified voltage VCC output by the power receiving circuit 61, the control state of the charging circuit 65 controlled by the charging system control circuit 63, the charging capacity of the battery 90 calculated by the charging system control circuit 63, and the like to the external device. The communication circuit 69 receives information output from the external device, and stores the information in the nonvolatile memory 68 via the charging system control circuit 63. The communication method of the communication circuit 69 is not particularly limited. Examples of the external device include various portable information terminals such as a smartphone and a tablet terminal, a biological information measurement apparatus (wearable terminal), a wristwatch, a wrist computer, and an in-vehicle device.

The discharging system circuit 70 shown in FIG. 2 is a circuit that performs a discharge operation of the battery 90, and supplies discharge power to the processing circuit 100. Specifically, the discharging system circuit 70 operates based on the battery voltage VBAT of the battery 90, and supplies an output voltage VOUT to the processing circuit 100. With this configuration, the processing circuit 100 operates based on the output voltage VOUT.

The power supply circuit 71 supplies the output voltage VOUT based on the battery voltage VBAT to the processing circuit 100. The power supply circuit 71 shown in FIG. 2 includes a charge pump circuit 711. The charge pump circuit 711 performs a charge pump operation of stepping down the battery voltage VBAT, and generates the output voltage VOUT. Then, the charge pump circuit 711 supplies the generated output voltage VOUT to the processing circuit 100.

The charge pump circuit 711 is realized by, for example, a DC-DC converter (a switching regulator). Instead of the charge pump circuit 711, a linear regulator (an analog regulator) may also be used.

The discharging system control circuit 73 controls the operation of the power supply circuit 71 such that the power supply circuit 71 generates and outputs the output voltage VOUT based on the battery voltage VBAT. The discharging system control circuit 73 also controls the operations of the interface circuit 74 and the register 76. The discharging system control circuit 73 controls interface processing of the interface circuit 74, and controls writing and reading of information to and from the register 76, for example.

The above-described charging system control circuit 63 and the discharging system control circuit 73 constitute a control unit 80. That is to say, the control unit 80 includes circuits (the charging system control circuit 63 and the like) that operate with power supplied from the power receiving circuit 61 and control the operation of the charging circuit 65 and the like, and circuits (the discharging system control circuit 73 and the like) that operate with power supplied from the battery 90 and control the operation of the power supply circuit 71.

The interface circuit 74 is a circuit that performs interface processing with the processing circuit 100. The interface circuit 74 performs, for example, interface processing of receiving a command issued by the processing circuit 100 or receiving information set by the processing circuit 100. The interface circuit 74 is realized by, for example, a serial interface circuit such as an SPI (Serial Peripheral Interface) or an I2C (Inter-Integrated Circuit). The interface circuit 74 may also be, for example, a serial interface circuit or a parallel interface circuit using differential signals.

Various types of information are written to the register 76 by the processing circuit 100 via the interface circuit 74. The various types of information written in the register 76 are read by the processing circuit 100 via the interface circuit 74.

The register 76 is realized by, for example, a flip-flop circuit, a memory such as a RAM (Random Access Memory), or the like.

Examples of various types of information include a command provided from the processing circuit 100 and information on current setting.

The interface circuit 74 and the register 76 operate based on either the battery voltage VBAT output from the battery 90 or the rectified voltage VCC output from the power receiving circuit 61.

The monitoring circuit 77 monitors the operation state of the discharging system control circuit 73, that is, the control operation of the power supply circuit 71, and stops, when an abnormality is recognized, the supply of the output voltage VOUT supplied by the power supply circuit 71.

The control circuit 50 receives a current setting provided from the processing circuit 100. When the processing circuit 100 issues a command for the current setting of the constant current charging or sets information for the current setting of the constant current charging, for example, the control circuit 50 receives the command or the setting of the information. Then, the control circuit 50 performs constant current charging based on the current setting set by the processing circuit 100. Specifically, the control circuit 50 performs constant current charging for charging the battery 90, using a current value corresponding to a current mode as a charging current. Also, when the current setting is a current value, the control circuit 50 performs constant current charging for charging the battery 90 with the set current value as a charging current.

The nonvolatile memory 68 stores a current value corresponding to the current mode. When the current setting includes, for example, a first current mode in which constant current charging is performed with a first current value and a second current mode in which constant current charging is performed with a second current value that is different from the first current value, the nonvolatile memory 68 stores the first current value and the second current value. Then, when a command for setting the first current mode is issued by the processing circuit 100, the charging system control circuit 63 reads the current setting stored in the register 76, and reads the first current value stored in the nonvolatile memory 68 based on the current setting. In this manner, the charging system control circuit 63 controls the operation of the charging circuit 65 to perform constant current charging at the first current value. Also, when a command for setting the second current mode is issued by the processing circuit 100, the charging system control circuit 63 reads the current setting stored in the register 76, and reads the second current value stored in the nonvolatile memory 68 based on the current setting. In this manner, the charging system control circuit 63 controls the operation of the charging circuit 65 to perform constant current charging at the second current value.

In this manner, by charging the battery 90 while using a plurality of current modes having different current values, the charging time can be shortened or the deterioration of the battery 90 can be suppressed in accordance with the environment around the battery 90, the specifications, the type, and the like of the battery 90. As a result, optimum charging according to the state of the battery 90 becomes possible.

The charging system control circuit 63 may also autonomously control the charging current of the constant current charging. In other words, the charging system control circuit 63 may also be configured to autonomously control the operation of the charging circuit 65 based on the A/D conversion value of the battery voltage VBAT.

In the control circuit 50 as described above, before charging the battery 90, the battery voltage VBAT of the battery 90 is divided into a plurality of voltage sections, and then the plurality of voltage sections are stored in the nonvolatile memory 68 in advance. Each voltage section has a lower limit voltage value and an upper limit voltage value.

As will be described in detail later, when the battery 90 is charged, the charging circuit 65 charges the battery 90 with a predetermined charging current in accordance with an instruction provided from the charging current control circuit 631. Although the battery voltage VBAT increases with the progress of charging, the time measurement circuit 632 measures the time required for the battery voltage VBAT to reach the upper limit voltage value after exceeding the lower limit voltage value of each voltage section. The arithmetic circuit 633 obtains a section charging capacity corresponding to each voltage section based on the product of the charging current and the corresponding required time, and stores the obtained section charging capacities in the register 76.

On the other hand, when the battery 90 is discharged, the battery voltage VBAT is obtained by the A/D conversion circuit 66. Then, the charging capacity obtainment circuit 634 reads one of the plurality of the section charging capacities stored in the register 76, based on the battery voltage VBAT or the calculated value of the battery voltage VBAT. The read section charging capacity serves as an index for obtaining the charging capacity of the battery 90 at that time. Accordingly, the charging capacity of the battery 90 can be easily obtained with high accuracy, based on the section charging capacity.

The charging system control circuit 63 shown in FIG. 2 includes an internal resistance value measurement circuit 635 that measures the internal resistance value of the battery 90. The target to be measured by the time measurement circuit 632, describe above, may be the battery voltage VBAT at the time of charging, but it is preferable that the target is a cell voltage obtained by excluding the voltage increase due to the internal resistance of the battery 90 from the battery voltage VBAT. The voltage increase refers to an increase width when the charging voltage increases due to the internal resistance of the battery 90 at the time of charging the battery 90. This voltage increase varies depending on, for example, the type of battery 90, individual differences, and the like, and thus has large uncertainty. For this reason, it is preferable that the target of the time measurement by the time measurement circuit 632 is not the battery voltage VBAT at the time of charging obtained by the A/D conversion circuit 66, but the cell voltage obtained as the difference obtained by subtracting the voltage increase from the battery voltage VBAT at the time of charging. In this manner, the required time can be measured based on the cell voltage with less uncertainty. As a result, the charging capacity of the battery 90 can be obtained more accurately regardless of the type or individual difference of the battery 90.

The voltage increase can be obtained as the product of the internal resistance value of the battery 90 and the current value of the charging current. For this reason, when the type of battery 90 changes or the deterioration of the battery 90 progresses, the voltage increase can be calculated based on the internal resistance value measured by the internal resistance value measurement circuit 635.

Also, the internal resistance value measurement circuit 635 can measure the internal resistance value of the battery 90 by a known measurement method, such as a direct current method or an alternating current method. The internal resistance value measurement circuit 635 may be provided as necessary. When the internal resistance value of the battery 90 is known, for example, the internal resistance value input from the outside may also be used instead of the measurement value.

Furthermore, in the case of determining a plurality of voltage sections to be stored in the nonvolatile memory 68, the voltage sections may be determined based on the battery voltage VBAT at the time of charging in the same manner as described above, but are preferably determined based on the cell voltage.

On the other hand, when the voltage sections are determined based on the cell voltage and the time measurement circuit 632 also measures the required time based on the cell voltage, and when the charging capacity obtainment circuit 634 reads the section charging capacity stored in the register 76, it is preferable to read the section charging capacity based on the cell voltage obtained as the sum of the battery voltage VBAT at the time of discharging and the voltage decrease. In this manner, the charging capacity of the battery 90 can be obtained more accurately regardless of the type or individual difference of the battery 90.

The voltage decrease is equivalent to the voltage increase described above, and thus the voltage decrease is obtained in the same manner as the voltage increase.

In the following description, a case where various calculations are performed based on the cell voltage obtained from the battery voltage VBAT will be described as an example. The battery voltage VBAT may be used as it is without being converted into the cell voltage, or another calculated value may also be used.

Examples of the charge and discharge control apparatus 10 described above include a semiconductor IC chip such as an ASIC (Application Specific Integrated Circuit). The IC chip is, for example, a circuit device mounted in a package. The circuit device that realizes the processing circuit 100 is an IC chip different from the IC chip of the charge and discharge control apparatus 10. However, the charge and discharge control apparatus 10 that realizes the control circuit 50 and the circuit device that realizes the processing circuit 100 may also be one IC chip or may also be mounted in one package. The charge and discharge control apparatus 10 may also have a structure in which a plurality of circuit devices are coupled via a wiring substrate or the like. Of the elements included in the control circuit 50, for example, the time measurement circuit 632, the nonvolatile memory 68, the register 76, and the like may also be provided outside the IC chip including the charging circuit 65 and the power supply circuit 71.

2.2 Operation Example of Charge and Discharge Control Apparatus

Next, an example of the operation of the charge and discharge control apparatus 10 will be described for each of the cases, namely, for the cases of before the charging operation, during the charging operation, and during the discharging operation.

2.2.1 Before Charging Operation

In the charge and discharge control apparatus 10, prior to charging of the battery 90, as described above, the cell voltage of the battery 90 is divided into the plurality of voltage sections, and the voltage sections are stored in the nonvolatile memory 68. The cell voltage to be divided is, for example, a cell voltage of the battery 90 in a state in which charging is completed, that is, in a fully charged state, but may also be a cell voltage in other states.

FIG. 3 is a table showing an example of the lower limit voltage values and an example of the upper limit voltage values of the voltage sections Div0 to Div7 stored in respective addresses of the nonvolatile memory 68 shown in FIG. 2. In the example shown in FIG. 3, the lower limit voltage value and the upper limit voltage value of each of the voltage sections Div0 to Div7 when the cell voltage of the battery 90 is divided into eight voltage sections from the zeroth voltage section Div0 to the seventh voltage section Div7 are illustrated. The lower limit voltage value and the upper limit voltage value overlap with each other in adjacent voltage sections, and thus the overlapping voltage value is shown at one address in FIG. 3.

Accordingly, the upper limit voltage value of the zeroth voltage section Div0 and the lower limit voltage value of the first voltage section Div1 are the common voltage V_Div 0.

The upper limit voltage value of the first voltage section Div1 and the lower limit voltage value of the second voltage section Div2 are the common voltage V_Div 1.

The upper limit voltage value of the second voltage section Div2 and the lower limit voltage value of the third voltage section Div3 are the common voltage V_Div 2.

The upper limit voltage value of the third voltage section Div3 and the lower limit voltage value of the fourth voltage section Div4 are the common voltage V_Div 3.

The upper limit voltage value of the fourth voltage section Div4 and the lower limit voltage value of the fifth voltage section Div5 are the common voltage V_Div 4.

The upper limit voltage value of the fifth voltage section Div5 and the lower limit voltage value of the sixth voltage section Div6 are the common voltage V_Div 5.

The upper limit voltage value of the sixth voltage section Div6 and the lower limit voltage value of the seventh voltage section Div7 are the common voltage V_Div 6.

In FIG. 3, the cell voltage at the completion of charging is "voltage V_Div 7".

The number of voltage sections stored in the nonvolatile memory 68 may be changed as appropriate according to the type of the battery 90, and is no particularly limited. Accordingly, the number of voltage sections stored in the nonvolatile memory 68 may also be more or less than eight.

The lower limit voltage values and the upper limit voltage values of the voltage sections Div0 to Div7 may be stored in the nonvolatile memory 68 at the stage of manufacturing the charge and discharge control apparatus 10, or may also be values input and stored in the nonvolatile memory 68 after the charge and discharge control apparatus 10 is manufactured.

Because the nonvolatile memory 68 has non-volatility, the lower limit voltage values and the upper limit voltage values of the voltage sections Div0 to Div7 are continuously stored, even when the power supply of the charge and discharge control apparatus 10 is shut down. Accordingly, because the first register that stores the plurality of voltage sections Div0 to Div7 includes the nonvolatile memory 68, it is possible to maintain the information of the voltage sections Div0 to Div7, regardless of the state of the power supply of the charge and discharge control apparatus 10.

2.2.2 During Charging Operation

When charging the battery 90, the charging current control circuit 631 instructs the current value of the charging current necessary for charging the battery 90 by the charging circuit 65. As described above, the current value of the charging current may be a value read from the current value stored in the nonvolatile memory 68 based on the control by the processing circuit 100, may also be a value directly instructed from the processing circuit 100, or may also be a value autonomously set by the charging system control circuit 63.

The charging circuit 65 performs charging with a predetermined charging current, based on an instruction from the charging current control circuit 631. Although the cell voltage increases with the progress of charging, the time measurement circuit 632 measures the time required from when the cell voltage exceeds the lower limit voltage value to when the cell voltage reaches the upper limit voltage value in each of the voltage sections Div0 to Div7.

The required times can be measured based on a clock signal output from the oscillation circuit 67. The oscillation circuit 67 generates a clock signal that oscillates at predetermined time intervals. The time measurement circuit 632 can measure a freely-set time by counting the oscillation of the clock signal. Specifically, the time measurement circuit 632 counts the oscillation of the clock signal from when the cell voltage exceeds the lower limit voltage value to when the cell voltage reaches the upper limit voltage value of each of the voltage sections Div0 to Div7, and obtains the required time.

FIG. 4 is a graph showing the relationship between the elapsed time and the battery voltage VBAT and the cell voltage VCEL when the battery 90 is charged, and the relationship between the elapsed time and the current value CC of the charging current. FIG. 4 also shows eight voltage sections Div0 to Div7, required times T0 to T7 that are obtained from the respective voltage sections Div0 to Div7, and the register 76 that stores section charging capacities Capa0 to Capa7 obtained from the required times T0 to T7 and the current value CC of the charging current.

In FIG. 4, first, the constant current charging of the battery 90 is started from an uncharged state in which the battery voltage VBAT is less than 3.2V. The current value CC of the charging current shown in FIG. 4 is a constant current. After the constant current continues for a certain period of time, the charging is switched to the constant voltage charging, and the current value CC of the charging current decreases with time.

The battery voltage VBAT shown in FIG. 4 rapidly increases immediately after the start of the constant current charging. The increase width of the voltage value is obtained by the product (voltage change AV) of the internal resistance value of the battery 90 and the current value CC of the charging current. Thereafter, the battery voltage VBAT increases almost monotonously with time, and is maintained at a constant value at the timing of switching to the constant voltage charging. The voltage value at this time is the battery voltage VBAT at the time of full charge.

On the other hand, the cell voltage VCEL shown in FIG. 4 increases substantially in parallel with the battery voltage VBAT. Thereafter, the rate of increase decreases at the timing of switching to constant voltage charging, and finally, the cell voltage VCEL and the battery voltage VBAT coincide with each other. The voltage value at this time is the cell voltage VCEL at the time of full charge.

In FIG. 4, as an example, the voltage of 3.2V is set as a threshold value between the over-discharged state and the charged state. The voltage range between the voltage of 3.2V and the cell voltage VCEL in a fully charged state is divided into eight voltage sections Div0 to Div7 at equal intervals. The zeroth voltage section Div0 shown in FIG. 4 is a voltage section in which the voltage of 3.2V is a lower limit voltage value and the voltage V_Div0 is an upper limit voltage value. The time required for the voltage increase in the zeroth voltage section Div0 during charging is the required time T0 shown in FIG. 4. Furthermore, the charging capacity obtained from the required time T0 is the section charging capacity Capa0 shown in FIG. 4.

The first voltage section Div1 shown in FIG. 4 is a voltage section in which the voltage V_Div0 is a lower limit voltage value and the voltage V_Div1 is an upper limit voltage value. The time required for the voltage increase in the first voltage section Div1 is the required time T1 shown in FIG. 4. Furthermore, the charging capacity obtained from the required time T1 is the section charging capacity Capa1 shown in FIG. 4.

The second voltage section Div2 shown in FIG. 4 is a voltage section in which the voltage V_Div1 is a lower limit voltage value and the voltage V_Div2 is an upper limit voltage value. The time required for the voltage increase in the second voltage section Div2 is the required time T2 shown in FIG. 4. Furthermore, the charging capacity obtained from the required time T2 is the section charging capacity Capa2 shown in FIG. 4.

The third voltage section Div3 shown in FIG. 4 is a voltage section in which the voltage V_Div2 is a lower limit voltage value and the voltage V_Div3 is an upper limit voltage value. The time required for the voltage increase in the third voltage section Div3 is the required time T3 shown in FIG. 4. Furthermore, the charging capacity obtained from the required time T3 is the section charging capacity Capa3 shown in FIG. 4.

The fourth voltage section Div4 shown in FIG. 4 is a voltage section in which the voltage V_Div3 is a lower limit voltage value and the voltage V_Div4 is an upper limit voltage value. The time required for the voltage increase in the fourth voltage section Div4 is the required time T4 shown in FIG. 4. Furthermore, the charging capacity obtained from the required time T4 is the section charging capacity Capa4 shown in FIG. 4.

The fifth voltage section Div5 shown in FIG. 4 is a voltage section in which the voltage V_Div4 is a lower limit voltage value and the voltage V_Div5 is an upper limit voltage value. The time required for the voltage increase in the fifth voltage section Div5 is the required time T5 shown in FIG. 4. Furthermore, the charging capacity obtained from the required time T5 is the section charging capacity Capa5 shown in FIG. 4.

The sixth voltage section Div6 shown in FIG. 4 is a voltage section in which the voltage V_Div5 is a lower limit voltage value and the voltage V_Div6 is an upper limit voltage value. The time required for the voltage increase in the sixth voltage section Div6 is the required time T6 shown in FIG. 4. Furthermore, the charging capacity obtained from the required time T6 is the section charging capacity Capa6 shown in FIG. 4.

The seventh voltage section Div7 shown in FIG. 4 is a voltage section in which the voltage V_Div6 is a lower limit voltage value and the voltage V_Div7 is an upper limit voltage value. The time required for the voltage increase in the seventh voltage section Div7 is the required time T7 shown in FIG. 4. Furthermore, the charging capacity obtained from the required time T7 is the section charging capacity Capa7 shown in FIG. 4.

The arithmetic circuit 633 reads the current value CC of the charging current instructed by the charging current control circuit 631 and the required times T0 to T7 measured by the time measurement circuit 632. Then, the arithmetic circuit 633 obtains the products of the current value CC of the charging current and the required times T0 to T7 as the section charging capacities Capa0 to Capa7 corresponding to the respective voltage sections Div0 to Div7. The arithmetic circuit 633 stores the obtained section charging capacities Capa0 to Capa7 in the register 76. In the register 76, addresses corresponding to the number of voltage values that divides the voltage range into the eight voltage sections Div0 to Div7 are set.

FIG. 5 is a table showing the section charging capacities Capa0 to Capa7 stored in the respective addresses of the register 76 shown in FIG. 2.

The voltage V_Div0 (a lower limit voltage value) and the voltage V_Div1 (an upper limit voltage value) are stored in one address of the nonvolatile memory 68 shown in FIG. 3 described above. The time measurement circuit 632 starts time measurement when the cell voltage VCEL during charging reaches the voltage V_Div0, and ends the time measurement when the cell voltage VCEL reaches the voltage V_Div1. In this manner, the required time T1 for the voltage increase in the first voltage section Div1 can be obtained. For the voltage sections other than the first voltage section Div1, the required times can be obtained in the same manner as above.

Next, the arithmetic circuit 633 calculates the product of the current value CC of the charging current and, for example, the required time T1 corresponding to the first voltage section Div1. Then, the calculation result is stored in a corresponding address of the register 76, as the section charging capacity Capa1 of the first voltage section Div1. In this manner, according to the progress of charging, the section charging capacities Capa0 to Capa7 from the zeroth voltage section Div0 to the seventh voltage section Div7 are calculated, and stored in the register 76.

When the cell voltage VCEL does not increase until reaching the seventh voltage section Div7 and charging is terminated at the time when the cell voltage VCEL increases until a point in the middle of the sixth voltage section Div6, for example, the section charging capacity Capa6 up to the middle point is stored at the address corresponding to the sixth voltage section Div6 of the register 76, and the section charging capacity Capa7 is not updated at the address corresponding to the seventh voltage section Div7.

Also, for example, when the cell voltage VCEL at the start of charging is located in the second voltage section Div2 and the cell voltage VCEL at the end of charging is located in the sixth voltage section Div6, only the section charging capacities Capa3 to Capa5 may be updated.

When the section charging capacities Capa0 to Capa7 are written to the respective addresses of the register 76, if the past section charging capacities Capa0 to Capa7 are already stored, the section charging capacities are updated with newly obtained values. As a result, the latest section charging capacities Capa0 to Capa7 are stored in the register 76. The section charging capacities Capa0 to Capa7 generally change due to deterioration, temperature, or the like of the battery 90. For this reason, the register 76 preferably has a function of updating the section charging capacities to new values. With this configuration, even when the state of the battery 90 changes, the charging capacity of the battery 90 can be obtained more accurately.

In each address of the register 76 shown in FIG. 5, update information UPDT indicating whether or not the content of the address has been updated is also stored. This makes it possible to easily check whether the content has been updated.

2.2.3 During Discharging Operation

When the battery 90 is discharged, the battery voltage VBAT is measured by the A/D conversion circuit 66, and the cell voltage VCEL is obtained by the arithmetic circuit 633. Then, the charging capacity obtainment circuit 634 reads at least one of the plurality of section charging capacities Capa0 to Capa7 stored in the register 76, based on the cell voltage VCEL. In this manner, based on the battery voltage VBAT, the section charging capacity corresponding to that battery voltage VBAT can be obtained. The read section charging capacity is highly likely to be updated each time charging is performed, and thus reflects a relatively recent state of the battery 90. For this reason, by obtaining the charging capacity of the battery 90 based on the read section charging capacity, the charging capacity of the battery 90 can be obtained more accurately.

When the cell voltage VCEL obtained when the battery 90 is discharged is located in the sixth voltage section Div6, for example, the sum of the total of the section charging capacities Capa0 to Capa5 and a part of the section charging capacity Capa6 is the charging capacity of the battery 90 at that time.

The part of the section charging capacity Capa6 can be roughly obtained by the arithmetic circuit 633, based on the lower limit voltage value and the upper limit voltage value of the sixth voltage section Div6 and the cell voltage VCEL at the time of discharging. When the cell voltage VCEL at the time of discharging is located between the lower limit voltage value and the upper limit voltage value of the sixth voltage section Div6, for example, the sum of the total of the section charging capacities Capa0 to Capa5 and half of the section charging capacity Capa6 is the charging capacity of the battery 90 at that time.

As described above, the charge and discharge control apparatus 10 according to the present embodiment is an apparatus configured to control charge and discharge of the battery 90 and to obtain the charging capacity of the battery 90, and includes: the A/D conversion circuit 66 that is a voltage measurement circuit; the charging current control circuit 631; the nonvolatile memory 68 that is the first register; the time measurement circuit 632; the arithmetic circuit 633; the register 76 that is the second register; and the charging capacity obtainment circuit 634. The A/D conversion circuit 66 measures the battery voltage VBAT of the battery 90. The charging current control circuit 631 controls the charging current flowing at the time of charging the battery 90. The nonvolatile memory 68 is configured to store the plurality of voltage sections Div0 to Div7 each having a lower limit voltage value and an upper limit voltage value. The time measurement circuit 632 measures, for each voltage section, a time required for the battery voltage VBAT at the time of charging the battery 90 or the calculated value of that battery voltage VBAT to reach the upper limit voltage value after exceeding the lower limit voltage value. The arithmetic circuit 633 obtains the section charging capacities Capa0 to Capa7 corresponding to the respective voltage sections, based on the products of the current value CC of the charging current and the required times T1 to T7. The register 76 stores the section charging capacities Capa0 to Capa7. The charging capacity obtainment circuit 634 reads at least one of the plurality of section charging capacities Capa0 to Capa7 stored in the register 76, based on the battery voltage VBAT at the time of discharging the battery 90 or the calculated value of that battery voltage VBAT.

According to such a configuration, it is possible to more accurately obtain the charging capacity of the battery 90 without using a complicated circuit. Accordingly, the user of the electronic device 30 can know the charging capacity of the battery 90 more accurately, and can enjoy high convenience. Also, because the configuration is relatively simple, it is easy to reduce the size of the charge and discharge control apparatus 10.

Furthermore, because the section charging capacities Capa0 to Capa7 are updated each time charging is performed, even when the deterioration of the battery 90 progresses, information reflecting the deterioration of the battery 90 is stored in the register 76. Accordingly, even in the battery 90 in which deterioration has progressed, the charging capacity can be obtained with high accuracy.

As described above, the charge and discharge control apparatus 10 may also include the internal resistance value measurement circuit 635 that measures the internal resistance value of the battery 90. In this case, the charge and discharge control apparatus 10 preferably uses the cell voltage VCEL that is obtained based on the battery voltage VBAT and a voltage change (voltage increase or voltage decrease) that is obtained based on the product of the internal resistance value and the current value CC of the charging current, as the calculated value of the battery voltage VBAT. In this manner, the charging capacity of the battery 90 can be obtained more accurately regardless of the type or individual difference of the battery 90.

As described above, the cell voltage VCEL at the time of charging the battery 90 is obtained as the difference obtained by subtracting the voltage increase from the battery voltage VBAT at the time of charging the battery 90. Also, the cell voltage VCEL at the time of discharging the battery 90 is obtained as the sum of the battery voltage VBAT at the time of discharging the battery 90 and the voltage decrease. In this manner, similarly to the above case, the charging capacity of the battery 90 can be obtained more accurately regardless of the type or individual difference of the battery 90.

3. Charge and Discharge Control Apparatus according to Second Embodiment

Next, a charge and discharge control apparatus 10 according to a second embodiment will be described.

Figure 6:
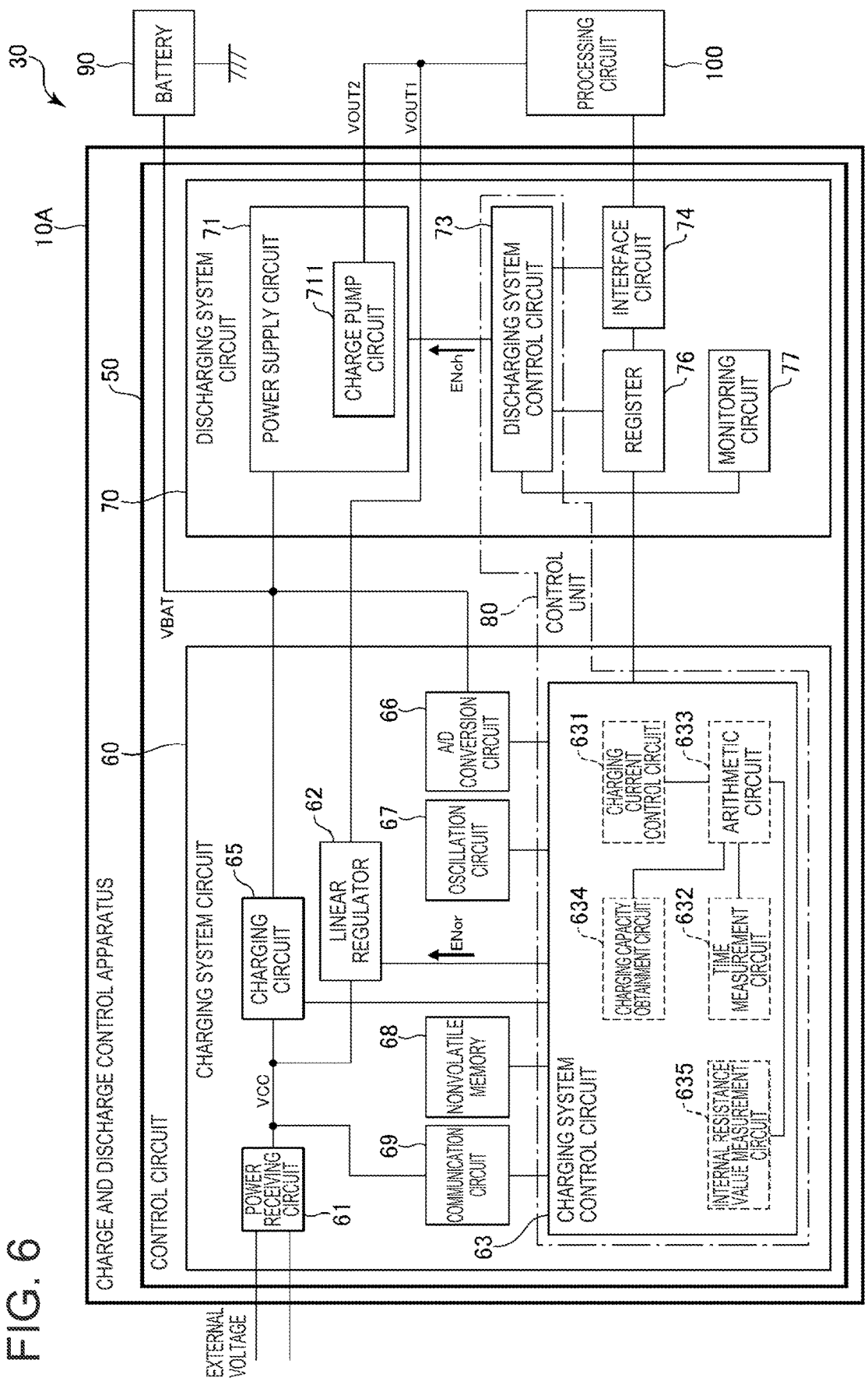
FIG. 6 is a block diagram showing a detailed configuration of an electronic device including a charge and discharge control apparatus according to a second embodiment.

FIG. 6 is a block diagram showing a detailed configuration of an electronic device including a charge and discharge control apparatus according to the second embodiment.

Hereinafter, the second embodiment will be described. In the following description, differences from the first embodiment will be mainly described, and descriptions of similar matters will be omitted. In FIG. 6, the same components as those in the first embodiment are denoted by the same reference numerals.

3.1 Configuration of Charge and Discharge Control Apparatus

A charge and discharge control apparatus 10A according to the second embodiment includes a linear regulator 62, in addition to the charge and discharge control apparatus 10 according to the first embodiment.

A charging system circuit 60 shown in FIG. 6 includes the linear regulator 62, in addition to the charging system circuit according to the first embodiment. The linear regulator 62 has a function of receiving the rectified voltage VCC, operating based on the rectified voltage VCC, and supplying power to the processing circuit 100. Specifically, the linear regulator 62 steps down the rectified voltage VCC, generates a predetermined output voltage VOUT1, and supplies the output voltage VOUT1 to the processing circuit 100.

The linear regulator 62 is realized by, for example, an analog regulator such as an LDO (Low Dropout) regulator.

The charging system control circuit 63 controls the operation of the charging circuit 65 to charge the battery 90, and controls the operation of the linear regulator 62 to supply power to the processing circuit 100.

On the other hand, the power supply circuit 71 includes the charge pump circuit 711 as in the first embodiment. The charge pump circuit 711 performs a charge pump operation of stepping down the battery voltage VBAT, generates an output voltage VOUT2, and supplies the output voltage VOUT2 to the processing circuit 100.

In the charge and discharge control apparatus 10A described above, the supply source of power to the processing circuit 100 is switched between the linear regulator 62 and the charge pump circuit 711 by the operation of the charging system control circuit 63. Specifically, when the charge and discharge control apparatus 10A receives power from the outside, the charging system control circuit 63 switches the power supply source to the processing circuit 100 between the linear regulator 62 that outputs the output voltage VOUT1 and the charge pump circuit 711 that outputs the output voltage VOUT2, in accordance with the battery voltage VBAT. In other words, the charge and discharge control apparatus 10A is configured to supply the output voltage VOUT1 obtained by stepping down the rectified voltage VCC to the processing circuit 100 in accordance with the voltage value of the battery voltage VBAT when the charging circuit 65 receives the rectified voltage VCC.

With this configuration, when the charging circuit 65 receives the rectified voltage VCC, that is to say, when the power receiving circuit 61 receives, for example, an AC external voltage, the charge and discharge control apparatus 10A can supply power supplied from the linear regulator 62 to the processing circuit 100 without discharging the battery 90. By charging the battery 90 without discharging the battery 90, the current flowing through the battery 90 is only the charging current. In this manner, because the charging current and the discharging current are not mixed in the battery 90, the current value of the charging current instructed by the charging current control circuit 631 flows through the battery 90 almost as it is. As a result, the difference between the section charging capacity calculated by the arithmetic circuit 633 and the actual charging capacity is reduced, and the charging capacity of the battery 90 can be obtained more accurately.

The charge and discharge control apparatus 10A can supply power to the processing circuit 100, even when the battery 90 is in an over-discharged state. As a result, the processing circuit 100 can perform various processes regardless of the charging state of the battery 90.

When receiving an external voltage, the control circuit 50 may operate to supply the output voltage VOUT1 output from the linear regulator 62 to the processing circuit 100, regardless of the state of the battery 90. In this case, it is possible to suppress the noise mixed into the output voltage VOUT1 and to suppress the malfunction of the processing circuit 100 caused by the noise, by utilizing the advantage of the linear regulator 62 that noise is less likely to be generated than the switching regulator.

As described above, the charge and discharge control apparatus 10A according to the present embodiment includes: the charging circuit 65; the linear regulator 62 that is the first power supply circuit; the charge pump circuit 711 that is the second power supply circuit; and the control unit 80 that controls the operations of the linear regulator 62 and the charge pump circuit 711. The charging circuit 65 charges the battery 90 based on received power. The linear regulator 62 supplies power to the processing circuit 100 (the power supply target 99) based on received power. The charge pump circuit 711 supplies power to the processing circuit 100 based on discharge power output from the battery 90. Then, when the battery voltage VBAT of the battery 90 is lower than a predetermined threshold voltage VBF (a predetermined value), the control unit 80 causes the linear regulator 62 to supply power to the processing circuit 100.

With this configuration, the difference between the section charging capacity calculated by the arithmetic circuit 633 and the actual charging capacity is reduced, and thus the charging capacity of the battery 90 can be obtained more accurately.

The charge and discharge control apparatus 10A can supply power to the processing circuit 100, even when the battery 90 is in an over-discharged state. As a result, the processing circuit 100 can perform various processes regardless of the charging state of the battery 90.

3.2 Operation Example of Charge and Discharge Control Apparatus

Figure 7:
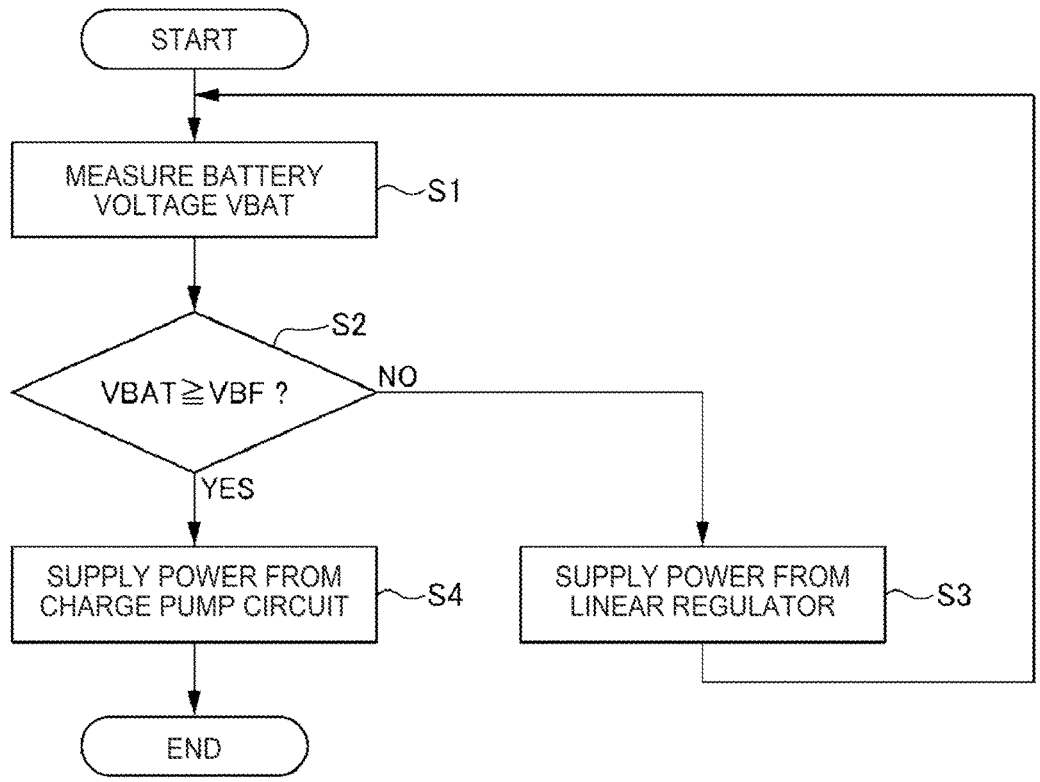
FIG. 7 is a flowchart showing an operation example of the charge and discharge control apparatus according to the second embodiment.

FIG. 7 is a flowchart showing an operation example of the charge and discharge control apparatus according to the second embodiment.

In the control circuit 50 shown in FIG. 6, when receiving an external voltage, as step S1, first, the battery voltage VBAT of the battery 90 in an open state is measured. Specifically, the A/D conversion circuit 66 performs A/D conversion (analog/digital conversion) of the battery voltage VBAT.

As step S2, the charging system control circuit 63 of the control unit 80 shown in FIG. 6 compares the A/D conversion value of the battery voltage VBAT with a predetermined threshold voltage VBF. When the battery voltage VBAT is lower than the threshold voltage VBF, the charging system control circuit 63 determines that the battery 90 is in an over-discharged state. On the other hand, when the battery voltage VBAT is the threshold voltage VBF or higher, the charging system control circuit 63 determines that the battery 90 is sufficiently charged and in a dischargeable state. The predetermined threshold voltage VBF can be stored in the nonvolatile memory 68, for example. The threshold voltage VBF is, for example, a lower limit value of the battery voltage VBAT at the time of the battery 90 being in a stable dischargeable state.

On the other hand, when the charging system control circuit 63 determines that the battery voltage VBAT is lower than the threshold voltage VBF, that is to say, the battery 90 is in an over-discharged state, the charging system control circuit 63 activates the control signal ENor used for controlling the operation of the linear regulator 62, as step S3. As a result, the linear regulator 62 supplies the output voltage VOUT1 to the processing circuit 100. The output voltage VOUT1 is a voltage obtained by stepping down the rectified voltage VCC.

In this case, the discharging system control circuit 73 of the control unit 80 shown in FIG. 6 deactivates the control signal ENch used for controlling the operation of the charge pump circuit 711. In this manner, the charge pump circuit 711 outputs no output voltage VOUT2. After step S3 ends, the process returns to step S1.

In step S1, the battery voltage VBAT of the battery 90 in an open state is measured again. In step S2, the battery voltage VBAT is compared with the threshold voltage VBF again. At this time, when the battery 90 has been sufficiently charged, the battery voltage VBAT becomes the threshold voltage VBF or higher.

In this case, the discharging system control circuit 73 determines that the battery 90 is in a dischargeable state, and activates the control signal ENch used for controlling the operation of the charge pump circuit 711, as step S4. As a result, the power supply circuit 71 supplies the output voltage VOUT2 to the processing circuit 100. The output voltage VOUT2 is a voltage obtained by stepping down the battery voltage VBAT to, for example, about one third of the battery voltage VBAT by the charge pump operation of the charge pump circuit 711. The step-down ratio is not particularly limited.

In this case, the charging system control circuit 63 deactivates the control signal ENor used for controlling the operation of the linear regulator 62. In this manner, the linear regulator 62 outputs no output voltage VOUT1.

The above operation example is an example, and the control circuit 50 may also continue to supply the output voltage VOUT1 of the linear regulator 62 to the processing circuit 100, even when the battery 90 reaches a dischargeable state.

When the battery voltage VBAT of the battery 90 is the threshold voltage VBF or higher, the control unit 80 preferably causes the charge pump circuit 711 to supply power to the processing circuit 100.

Because the charge pump circuit 711 is configured by, for example, a DC-DC converter (switching regulator), power consumption is smaller than that of the linear regulator 62. For this reason, the power consumption of the electronic device 30 can be reduced by supplying power from the charge pump circuit 711 when the battery 90 becomes dischargeable.

The charge pump circuit 711 preferably has a higher power conversion efficiency than the linear regulator 62. With this configuration, power consumption of the electronic device 30 can be reduced by supplying power from the charge pump circuit 711, even when an external voltage is received.

As described above, when the battery voltage VBAT of the battery 90 changes from less than the predetermined threshold voltage VBF to the threshold voltage VBF or higher, the control unit 80 switches the power supply source to the processing circuit 100 from the linear regulator 62 to the charge pump circuit 711.

According to such an operation, when an external voltage is received, the power supply can be switched to the power supply from the charge pump circuit 711 at the time when the charging of the battery 90 proceeds and the battery 90 becomes dischargeable. Accordingly, power can be preferentially supplied from the charge pump circuit 711 with low power consumption, so that power consumption in the charge and discharge control apparatus 10A can be reduced and power consumption of the electronic device 30 can be reduced. As a result, for example, when a battery (an external battery) or the like having a limited discharge amount is used as a power source of the external voltage, the discharge amount of the battery can be suppressed.

Figure 8:
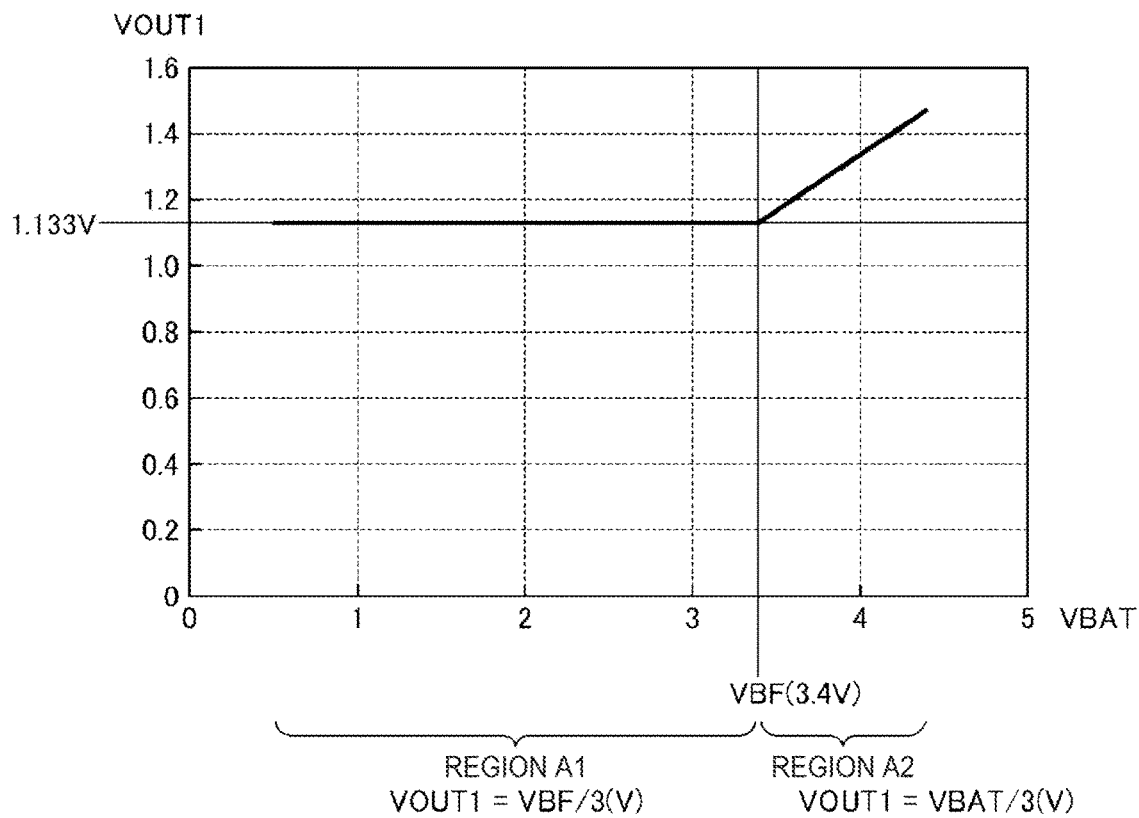
FIG. 8 is a diagram showing an example of a relationship between an output voltage VOUT1 output from a linear regulator shown in FIG. 6 and a battery voltage VBAT.

Here, FIG. 8 is a diagram showing an example of the relationship between the output voltage VOUT1 output from the linear regulator 62 shown in FIG. 6 and the battery voltage VBAT. FIG. 8 shows a case where the output voltage VOUT1 is output from the linear regulator 62, even when the battery voltage VBAT is the threshold voltage VBF or higher. In FIG. 8, as an example, the threshold voltage VBF is set to 3.4V.

When the battery voltage VBAT of the battery 90 is less than the threshold voltage VBF, that is to say, in the region A1 in FIG. 8, the linear regulator 62 outputs a constant voltage as the output voltage VOUT1. In FIG. 8, in the region A1 where the battery voltage VBAT indicated by the horizontal axis is lower than 3.4V, the output voltage VOUT1 indicated by the vertical axis is kept constant at 1.133V.

On the other hand, when the battery voltage VBAT of the battery 90 is the threshold voltage VBF or higher, that is to say, in the region A2 in FIG. 8, the linear regulator 62 outputs a voltage obtained by stepping down the battery voltage VBAT at a predetermined step-down ratio. In the example of FIG. 8, in the region A2 where the battery voltage VBAT indicated by the horizontal axis is 3.4V or higher, the output voltage VOUT1 indicated by the vertical axis substantially monotonically increases in conjunction with the battery voltage VBAT. In the region A2, the linear regulator 62 generates the output voltage VOUT1 corresponding to the battery voltage VBAT. For this reason, in the region A2, when the battery voltage VBAT increases with the progress of charging, the output voltage VOUT1 also increases accordingly.

Here, before and after the threshold voltage VBF, the voltage value is likely to fluctuate due to switching of the supply source. Specifically, as an operation example of the charging system control circuit 63, the output voltage VOUT1 output from the linear regulator 62 may be supplied to the processing circuit 100 in the region A1, and the output voltage VOUT2 output from the charge pump circuit 711 may be supplied to the processing circuit 100 in the region A2. In this case, in the region A1, the output voltage VOUT1, which is a constant voltage, is preferably set to a voltage value corresponding to the step-down ratio in the charge pump circuit 711. Specifically, when the step-down ratio in the charge pump circuit 711 is one-third, the output voltage VOUT1 is preferably set to one-third of the threshold voltage VBF. By setting such a voltage value, even when the supply source is switched, the voltage value can be prevented from becoming discontinuous, and the fluctuation of the voltage value can be minimized. As a result, the operation of the processing circuit 100 can be prevented from becoming unstable.

In the example of FIG. 8, the output voltage VOUT1 output from the linear regulator 62 is maintained at 1.133V, and this voltage value is calculated on the equation 3.4/3=1.133. In this case, the output voltage VOUT1 is preferably set within about ±5%, more preferably within about ±3% of one-third of the threshold voltage VBF.

Also, when the external voltage is interrupted at any timing, the supply source may be switched before and after the interruption, as described above. Also in this case, similarly to the above case, by optimizing the output voltage VOUT1 in the region A1, it is possible to minimize the fluctuation of the voltage value supplied to the processing circuit 100.

4. Modification of Charge and Discharge Control Apparatus

Next, a charge and discharge control apparatus 10B according to a modification will be described.

Figure 9:
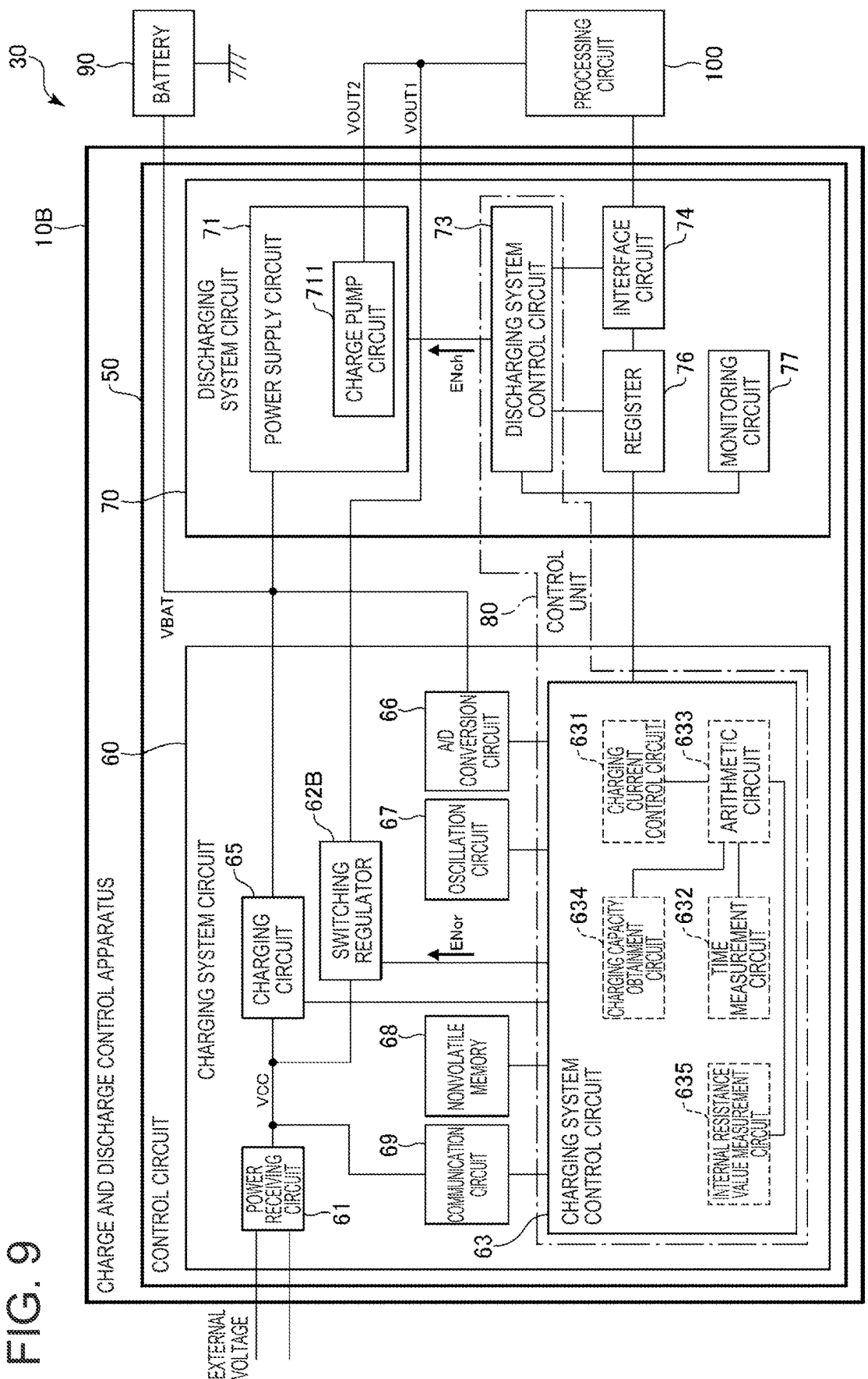
FIG. 9 is a block diagram showing a configuration of a charge and discharge control apparatus according to a modification.

FIG. 9 is a block diagram showing a configuration of the charge and discharge control apparatus according to the modification.

Hereinafter, the charge and discharge control apparatus 10B according to the modification will be described, but in the following description, differences from the charge and discharge control apparatus 10A according to the second embodiment will be mainly described, and the description of the same matter will be omitted. In FIG. 9, the same components as those in FIG. 6 are denoted by the same reference numerals.

The charge and discharge control apparatus 10B shown in FIG. 9 is the same as the charge and discharge control apparatus 10A shown in FIG. 6, except that a switching regulator 62B is used instead of the linear regulator 62 shown in FIG. 6.

The switching regulator 62B is realized by, for example, a DC-DC converter. The switching regulator 62B consumes less power than the linear regulator 62. Accordingly, the power consumption of the electronic device 30 can be reduced. For this reason, for example, in a case where a battery (an external battery) or the like having a limited discharge amount is used as a power supply of the external voltage, the discharge amount of the battery can be reduced and the battery can be used for a longer period of time.

Also in the above-described modification, the same effects as those of the second embodiment can be obtained.

5. Specific Example of Electronic Device

Figure 10:
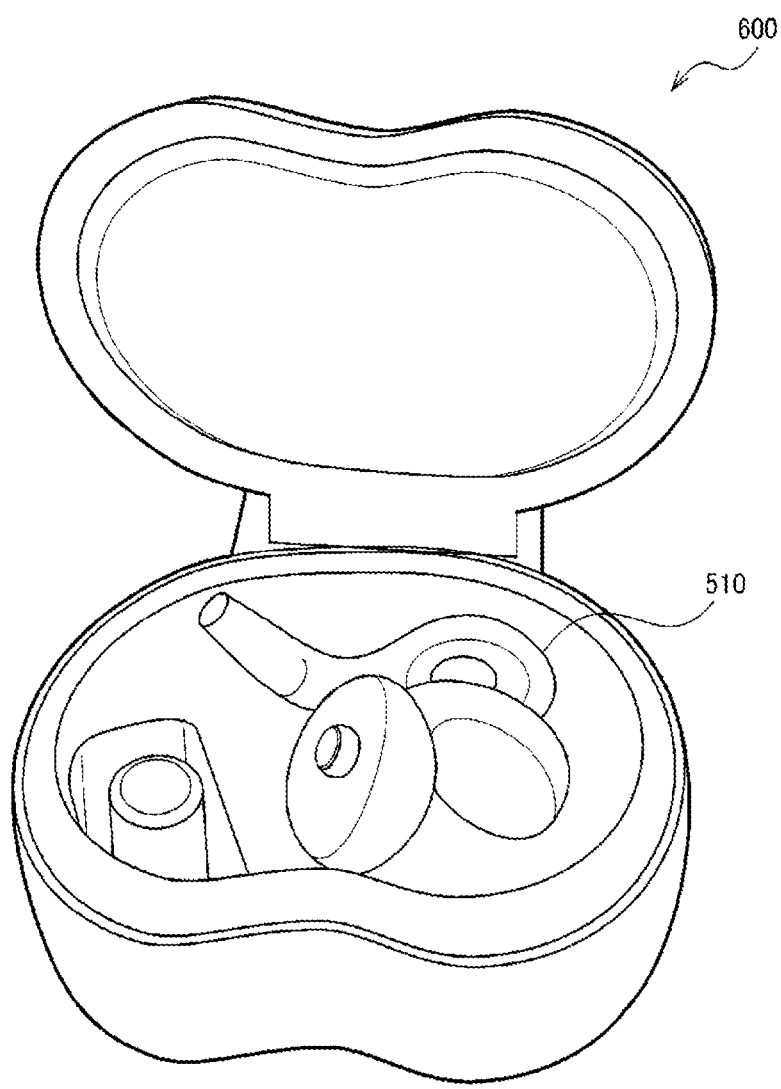
FIG. 10 is a perspective view showing an earphone, which is an example of the electronic device shown in FIG. 2, FIG. 6, or FIG. 9.

FIG. 10 is a perspective view showing an earphone, which is an example of the electronic device shown in FIG. 2, FIG. 6, or FIG. 9.

An earphone 510 shown in FIG. 10 may be, for example, an earphone of a hearing aid or an earphone for audio listening. Although not shown in FIG. 10, the earphone 510 (electronic device) includes the charge and discharge control apparatus 10, 10A, or 10B, the battery 90, and the processing circuit 100 shown in FIG. 2, FIG. 6, or FIG. 9.

The earphone 510 shown in FIG. 10 can be housed in a charging case 600. The earphone 510 may be coupled to the case 600 via a power supply cable or the like (not shown) and may be configured to receive power via the power supply cable, or may also be configured to receive power by contactless power transmission. The case 600 may also have a function of receiving power from the outside, or may also have a primary battery or a secondary battery different from the battery 90. In the latter case, a battery (an external battery) included in the case 600 serves as a power supply of the above-described external voltage.

As described above, the charge and discharge control apparatus 10, 10A, or 10B can more accurately obtain the charging capacity of the battery 90 without using a complicated circuit. Therefore, for example, when the earphone 510 has a function of communicating with an external device, it is possible to display the charging capacity of the battery 90 on the external device such as a smartphone, and thus it is possible to improve the convenience of the earphone 510.

In particular, the charge and discharge control apparatuses 10A and 10B can cause the processing circuit 100 to execute communication processing for establishing the communication with the external device, regardless of the state of the battery 90. In this manner, even when the battery 90 is in the over-discharged state, it is possible to cause the processing circuit 100 to execute the notification processing of notifying the information such as the charging capacity of the battery 90. In addition, the earphone 510 can be used while charging the earphone 510 regardless of the state of the battery 90, and thus convenience can be improved.

Examples of the electronic device 30 shown in FIG. 2, FIG. 6, or FIG. 9 include various devices such as a head-mounted display, a portable communication terminal such as a smartphone or a mobile phone, a wrist watch, a biological information measurement device, a shaver, an electric toothbrush, a wrist computer, a handy terminal, and an in-vehicle device of an automobile, in addition to a hearable device or a wearable device such as the earphone 510 shown in FIG. 10.

Although the charge and discharge control apparatus and the electronic device of the present disclosure have been described above based on the illustrated embodiment, the present disclosure is not limited thereto. In the charge and discharge control apparatus and the electronic device of the present disclosure, for example, the configuration of each unit of the embodiment may also be replaced with any configuration having the same function, or any configuration may also be added to the embodiment.

What is claimed is:

1. A charge and discharge control apparatus configured to control charge and discharge of a battery, and to obtain a charging capacity of the battery, comprising:

a voltage measurement circuit configured to measure a battery voltage of the battery;

a charging current control circuit configured to control a charging current flowing at the time of charging the battery;

a first register configured to store a plurality of voltage sections each including a lower limit voltage value and an upper limit voltage value;

a time measurement circuit configured to measure, for each voltage section, a time from when the battery voltage at the time of charging the battery or a calculated value of that battery voltage exceeds the lower limit voltage value to when that battery voltage or the calculated value of that battery voltage reaches the upper limit voltage value;

an arithmetic circuit configured to obtain section charging capacities corresponding to the respective voltage sections, based on products of a current value of the charging current and the times;

a second register configured to store the section charging capacities; and a charging capacity obtainment circuit configured to read at least one of the plurality of section charging capacities stored in the second register, based on the battery voltage at the time of discharging the battery or a calculated value of that battery voltage.

2. The charge and discharge control apparatus according to claim 1, comprising:

an internal resistance value measurement circuit configured to measure an internal resistance value of the battery, wherein the calculated value of the battery voltage is a cell voltage obtained based on the battery voltage and a voltage change that is obtained based on a product of the internal resistance value and the current value of the charging current.

3. The charge and discharge control apparatus according to claim 2, wherein the cell voltage at the time of charging the battery is the difference obtained by subtracting a voltage increase from the battery voltage at the time of charging the battery.

4. The charge and discharge control apparatus according to claim 1, wherein the first register includes a nonvolatile memory.

5. The charge and discharge control apparatus according to claim 1, wherein the second register has a function of updating the section charging capacities to new values.

6. The charge and discharge control apparatus according to claim 1, comprising:

a charging circuit configured to charge the battery based on received power;

a first power supply circuit configured to supply power to a power supply target based on received power;

a second power supply circuit configured to supply power to the power supply target based on discharge power output from the battery; and a control unit configured to control operations of the first power supply circuit and the second power supply circuit, wherein when the battery voltage is lower than a predetermined value, the control unit causes the first power supply circuit to supply power to the power supply target.

7. An electronic device comprising the charge and discharge control apparatus according to claim 1.

* * * * *